United States Patent [19]
Galvagni et al.

[11] Patent Number: 5,569,880
[45] Date of Patent: Oct. 29, 1996

[54] SURFACE MOUNTABLE ELECTRONIC COMPONENT AND METHOD OF MAKING SAME

[75] Inventors: John Galvagni, Surfside Beach; Sara P. E. Randall, Myrtle Beach, both of S.C.

[73] Assignee: AVX Corporation, Myrtle Beach, S.C.

[21] Appl. No.: 348,293

[22] Filed: Dec. 2, 1994

[51] Int. Cl.⁶ .................................................. H01L 23/02
[52] U.S. Cl. ........................... 174/52.4; 257/686; 361/790
[58] Field of Search ........................ 174/52.2, 52.4, 174/52.6; 257/666, 678, 685, 686, 787; 338/334, 315; 361/301.4, 735, 743, 766, 782, 773, 790, 820; 437/208, 209, 915; 439/72, 74, 83

[56] References Cited

U.S. PATENT DOCUMENTS

| | | | |
|---|---|---|---|
| 3,811,186 | 5/1974 | Larnerd et al. | 29/626 |
| 3,839,660 | 10/1974 | Stryker | 357/67 |
| 3,964,157 | 6/1976 | Kuhn et al. | 29/591 |
| 4,959,505 | 9/1990 | Ott | 174/52.2 |
| 5,012,388 | 8/1991 | Kabeshita et al. | 361/400 |
| 5,144,535 | 9/1992 | Megens et al. | 361/400 |
| 5,151,388 | 9/1992 | Bakhit et al. | 437/209 |
| 5,233,504 | 8/1993 | Melton et al. | 361/760 |
| 5,349,500 | 9/1994 | Casson et al. | 361/749 |

*Primary Examiner*—Kristine L. Kincaid
*Assistant Examiner*—Robert J. Decker
*Attorney, Agent, or Firm*—Mark T. Basseches

[57] ABSTRACT

A miniaturized surface mountable tombstoning resistant electronic component is disclosed. The terminals of the component are respectively L and J shaped conductive metal portions. The portions of the terminations covering the ends of the components are formed of a non-solder, wettable conductive metal, whereas the portions of the terminations underlying the bottom surface of the component are comprised of solder wettable metal. The disclosure further relates to a method of manufacturing the described termination structures.

3 Claims, 1 Drawing Sheet

SURFACE MOUNTABLE ELECTRONIC COMPONENT AND METHOD OF MAKING SAME

BACKGROUND OF THE INVENTION

The present invention is directed to a miniaturized surface mountable electronic component, illustratively, but without limitation, a capacitor, resistor, inductor or fuse.

PRIOR ART

With the current trend toward miniaturization of such electronic devices as computers, cellular phones and the like there is a concomitant trend toward reducing the size of the electronic components themselves, as well as efficiently utilizing the geography of the PC mother board to achieve a maximum concentration of electronic components on a given area of PC board.

In accordance with current practice, the most efficient mounting procedures involve surface mounting of the electronic component to the PC board. To this end, the various circuit paths of the PC board incorporate pads projecting from the surface of the board and spaced in accordance with the spacing of the terminals of the electronic component to be introduced into the circuit.

In surface mounting techniques actual affixation of the component is effected by melting of a solder ball or component intervening between the pads of the PC board and the terminals of the component.

The reduction in size and mass of electronic components has been a significant aid in the miniaturization process but has created problems in the handling and positioning of the components. For example, with conventional non-miniature capacitors it is possible, in part as a result of the mass of the capacitor, to simply position the capacitor in registry with the traces of the PC board with intervening solder balls, and by effecting melting of the solder balls (e.g. by wave soldering techniques) reliably bond the terminals of the capacitor to the pads of the board.

Miniature electronic components may be only minor fractions of an inch in their largest dimension and have masses which are orders of magnitude smaller than conventional non-miniaturized units. Typical electronic components of the miniature type include generally U-shaped terminations embracing the ends of the components and partially overlapping the upper and lower surface thereof. When such low mass miniature electronic component is positioned with intervening solder over the pads of a PC board and subjected to solder melting conditions, there is encountered a phenomenon known in the industry as "tombstoning". The term tombstoning is applied to the phenomenon of a component, the opposed terminations of which should each be bonded to a terminal pad, of the PC board becoming shifted upon melting of the solder in such manner that the component stands on end like a tombstone with one termination of the component soldered to one of the pads, the other termination being vertically spaced from the PC board and pad, the component thus being excluded from the circuit.

It is theorized that tombstoning results from the surface tension effects of the melting solder on the low mass component, and specifically on molten solder flowing along the end portion of the component to a greater degree at one end than at the other end. As a result, surface tension effects tend to draw that edge of the component downwardly resulting in a pivoting of the component about an axis parallel to the plane of the PC board resulting in the component being disposed in an upright or partly upright condition relative to the board rather than parallel to the board.

As a means of minimizing tombstoning, the industry has resorted to the utilization of oversized receptor pads on the PC board. The use of oversized pads enables the miniature component to be positioned such that the entirety of the under surface of the termination components of the electronic device are in registry with portions of the receptor pads. Thus, it is possible to locate the component within a range of positions over the pads with the reasonable assurance that substantially the entirety of the termination components register with some portion of the pad. When the solder is melted, the surface tension forces urging the component toward the pads is equalized at both ends of the component and the tendency toward tombstoning is minimized.

As will be evident from the preceding explanation, the requirement of providing enlarged pads is counterproductive in the context of efficient utilization of the PC geography, since the distance between the outermost extremities of the pads must always be greater than the length of the component. By thus increasing the spacing of the pads the number of components subject to application for a given area of PC board is reduced. If, for instance, it were possible for the length of the component to equal or exceed the spacing of the pads, it would then be possible to include a larger number of components over a given area of PC board surface.

SUMMARY OF THE INVENTION

The present invention is directed to a surface mountable, miniaturized electronic component, illustratively a capacitor, characterized in that the same is resistant to tombstoning, and may be located with respect to the conductive pads of a PC board in a less precise manner than components heretofore known without undermining the performance characteristics of the device.

The component of the invention is further advantageous in that a larger and hence higher value component may be located in a space which could accommodate only smaller lower value known components.

The invention is further directed to a method of manufacturing components of the type described.

Broadly stated, the component of the present invention includes a novel termination structure at each end comprised of a generally J-shaped vapor deposited band, the band covering the end portion of the component at which the internal electrodes are exposed, and also covering a limited length of a major (bottom) surface of the device. The deposited metal is comprised of one or more metals such a nickel, silver or the like, which are readily wettable by the solder component employed to affix the component to a PC board.

Following application of the J-shaped wettable metallic components, the entirety of the metallic components covering the ends of the component are over-coated by a conductive metallic component which is non-wettable by solder. The resulting component will provide conductive pads adjacent the ends of the bottom surface of the component which are receptive to solder, the adjacent ends of the component, while being conductive, are non-wettable by solder.

As a result, the component may be soldered by conventional means without fear of tombstoning, since there is no tendency, if the solder should extend over the ends of the device for the solder to exert a downward force on such ends as would be the case if the ends were made of a solder wettable metal.

It is important to note that the ends of the component (non-wettable but conductive metal) may still be accessed to enable in-circuit testing of the individual components after they have been attached to the PC board. This is in contrast to ceramic capacitors wherein terminations, such as tab terminations connected by solder bars, are disposed on a base surface of the capacitor spaced inwardly from the ends and therefore inaccessible to testing. The ends of such capacitors are comprised of ceramic, and, accordingly, if testing is to be effected contact must be made with the traces of the PC board which, to permit such contact, must extend beyond the plan projection of the component and, hence, be wasteful of surface area of the PC board.

The invention is further directed to a novel method of manufacturing the termination structure described. Briefly, the method involves stacking a series of capacitors to be terminated in a shingled relation such that the ends and a portion of a major surface adjacent the ends of the capacitors are exposed, the remaining portions of the capacitors being mutually shielded. Next a vapor deposition step applies the solder wettable metallic coating, which coating, due to the shingled orientation of the capacitors, will cover the entire ends of the capacitors and adjacent portions of a major surface of the capacitors. Thereafter, the capacitors are separated and stacked in such manner that the coated ends are in coplanar alignment, the coated components of the major surfaces being mutually shielded. Thereafter, a second layer or layers of non-solder wettable material are applied to the mutually masked capacitors to provide end or edge portions which are conductive and coupled to the internal electrodes of the component, but which are resistant to solder wetting.

With the foregoing in mind, it is an object of the invention to provide an electronic component having an improved termination scheme which renders same resistant to tombstoning and which enables more efficient use of the geography of a PC board surface.

A further object of the invention is to provide a termination method for forming an improved termination as described.

DETAILED DESCRIPTION OF DRAWINGS

Figure 1:
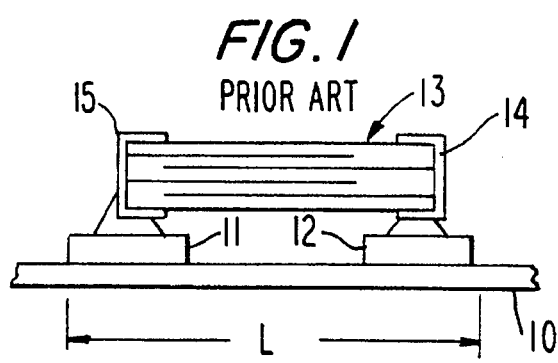
Fig. 1 is a schematic sectional view of a prior art device (capacitor) mounted to a PC board.

Referring now to the drawings and particularly to FIG. 1, there is illustrated a conventional electronic device (capacitor) having conventional terminations in soldered position on a PC board.

More particularly, the PC board 10 includes termination pads 11,12 which are connected by traces (not shown) of the PC board to other elements of the circuit. The capacitor 13 includes generally U-shaped end terminations 14,15. Typically, the terminations 14,15 will be made up of one or more layers which may be vapor deposited metal and may include a nickel layer adjacent the ceramic ends, covered by silver and/or solder layers.

Mounting to the pads 11,12 is effected by interposing a solder ball or like solder increment between terminations and pads and effecting melting of the solder to provide mechanical and electrical connection of the capacitor.

Figure 2:
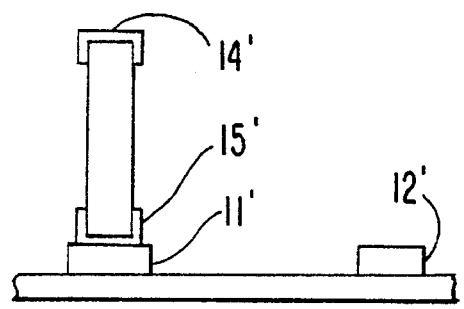
FIG. 2 is a view of a prior art device in the tombstone position.

In FIG. 2 there is schematically illustrated a capacitor which has tombstoned.

More particularly, in the course of the solder melt step the solder component intervening between terminal 15' and pad 11' has been permitted to flow over the end or edge of the termination. Due to surface tension effects, if the "pull" of the molten solder at one end of the capacitor exceeds that at the other the result will be as shown in FIG. 2.

In order to minimize tombstoning effects, it is the practice in the prior art to carefully control the quantum of solder intervening between termination and receptor pad, and more importantly to precisely position the component relative to the solder pads such that an equal length of termination of each side of the component is superposed over the solder pad. If, for instance, the component were applied such that only a portion of the termination at one end of the component registered with the solder pad, and the entirety of the other termination registered with the opposite solder pad, there would be a substantial tendency of the component to tombstone upon melting of the solder with the completely registering end of the component bonded to a pad, i.e. pad 11', and the opposite termination, e.g. 14', separated from pad 12'.

As will be apparent from the foregoing several significant disadvantages are encountered in connection with the prior art device. In order to facilitate the precise positioning necessary to avoid the tombstoning, the pads 11,12 must be made sufficiently wide that the entirety of the under surface of the terminations must be able to register with the pads in any of a series of slightly misaligned positions. By necessarily increasing the size of the pads, it is mandated that the overall size of the component 13 must necessarily be smaller than the spacing of the pads with resultant waste of surface area of the PC board.

Figure 3:
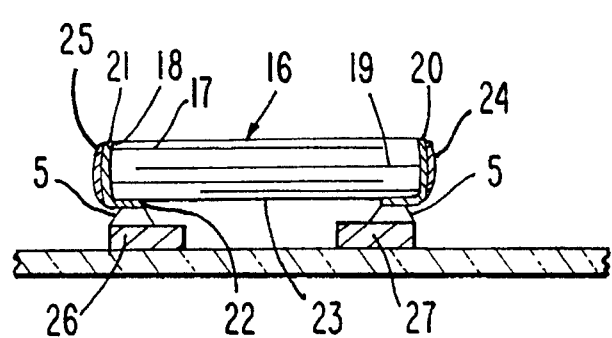
FIG. 3 is a vertical sectional view through a capacitor incorporating the termination structure of the present invention soldered to a PC board.

There is shown in FIG. 3 a capacitor 16 in accordance with the invention, it being understood that while a capacative device is illustrated the termination scheme of the invention is equally applicable to other electronic components. The capacitor 16, which is in the form of a right parallelepiped includes electrodes 17 of a first polarity exiting at end 18 of the capacitor, electrodes 19 exiting at end 20 of the capacitor. End 18 of the capacitor is covered by a first layer or layers 21 of solder receptive material. Illustratively and preferably via vapor deposition, the generally L-shaped component 21 may be comprised of sequential layers of nickel, silver, solder, etc. The total thickness of the layer 21 may vary from only a few thousand angstroms to a greater thickness in accordance with standard practice. The layer 21 covers the entirety of end 18 and includes a lowermost portion 22 which underlies the bottom surface 23 of the capacitor 16. The termination at the opposite end of the capacitor is a J-shape mirror image of the previously described termination.

A characterizing feature of the present invention resides in the over-coating of the ends 20,21 of the solder, wettable metal with a further coating 24,25 respectively of non-solder wettable metal.

By way of example and without limitation, the currently preferred non-solder, wettable metals are selected group of strong oxide forming metals such as chromium, tungsten, aluminum, titanium and alloys of these metals.

Referring now to FIG. 3, the capacitor 16 has been intentionally illustrated as attached by solder connections S to pads 26,27 in a manner in which the capacitor is slightly offset from a precise central registration with respect to the pads. This orientation is possible with the device of the invention, since the coatings 24,25 are resistant to connection to the solder and thus there is no tendency to tombstone. Similarly, if the land areas of the capacitor which register with the pads 26,27 are not precisely equal, the otherwise anticipated tombstoning effect is avoided.

A further benefit of the use of an electronic component having the termination scheme recited may be readily derived by a comparison of FIGS. 1 and 3, wherein capacitors of identical size have been juxtaposed. As is evident, because of the drawbacks of conventional terminated surface mount electronic components, it is necessary to provide space or length of a distance L between solder pads for mounting of the conventional capacitor. By comparison, in FIG. 3 substantial space exists between the outer edges of the capacitor and the vertical lines L1, L2 which are a projection of the spacing of pads 11 and 12. It is thus possible to use this spacing either to insert a larger capacitor within the same space L or to crowd additional components by more closely locating the mounting pads to enable more components to be mounted on a given surface area.

Figure 5:
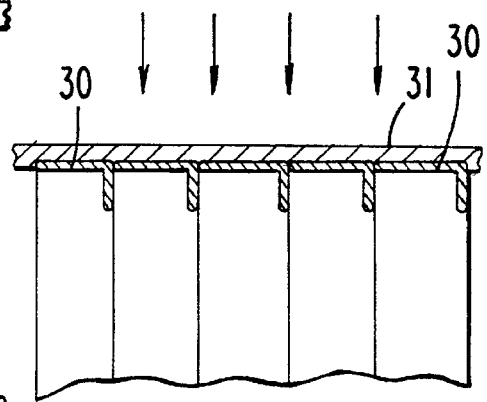
FIGS. 4 and 5 are sequential schematic views illustrating the method by which the termination structure in accordance with the invention is fabricated.
Figure 4:
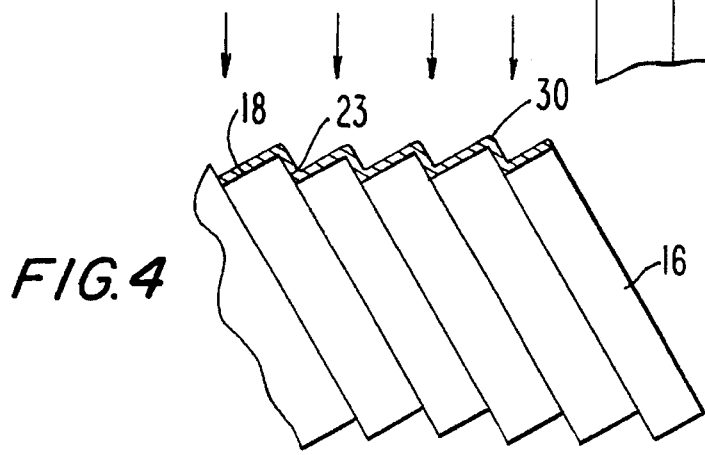

There is schematically illustrated in FIGS. 4 and 5 a novel method for manufacturing the termination structure of the instant invention. As seen in FIG. 4, a multiplicity of capacitors 16 have been assembled in a shingled fashion such that the entirety of the ends 18 are exposed along with minor adjacent portions of the bottom surface 23. When thus positioned, it will be appreciated that all other portions of the capacitors are mutually masked. When thus positioned (and with the side surfaces masked), a coating 30 is vapor deposited over the exposed said surfaces. Coating 30 which is preferably applied by a sputtering step may be comprised of one or more layers.

By way of example and in compliance with the best mode requirements of the U.S. patent laws, a first layer of 500 angstroms of chromium is preferably followed by a second layering of 3500 angstroms of nickel with a final coating of 3500 angstroms of silver. The coating, and particularly the outermost coating, is highly receptive to and readily wettable by solder.

The gang of components coated with the layer 30 are next separated and, as shown in FIG. 5, rearranged such that the coated end surfaces 18 are in coplanar alignment.

The rearranged devices are subjected to a further sputtering step to apply a layer 31, coating the exposed portions of the previously applied layer 30 insofar as those exposed portions cover the ends 18 of the capacitor, the layer 31 being masked from that portion of layer 30 which overlaps the bottom surfaces 23 of the capacitors. The layer 31 is formed of a non-solder, wettable or solder repellent coating of a strong oxide forming metal selected from the group which includes chromium, tungsten, aluminum, titanium and alloys thereof.

By way of example, the layer 31 may be comprised of a sputter applied layer of 500 angstroms thickness of chromium metal. Optionally a solder coating may be applied over the portions 23, localization of such coating being facilitated by the solder repellent layers 31.

Termination is completed by separating the capacitors and repeating the steps illustrated in FIGS. 4 and 5 to arrive at a capacitor as shown in FIG. 3.

As apparent from the preceding description, there is provided in accordance with the present invention a surface mountable capacitor which may be of extremely small size, and yet, despite its minimal mass, be resistant to tombstoning.

The component has the further advantage, due to the solder repellent nature of the end surfaces, of requiring less critical mounting, and enabling mounting to pads which are relatively closely spaced and which may be disposed totally within the confines located beneath the component. Since the end surfaces of the component are conductive, these surfaces are accessible for testing even though the PC pads may be shielded by the component. The termination structure enables optimal use of PC surface area enabling a larger number of components to be mounted in a given surface area.

As will be apparent from the preceding disclosure, skilled workers in the art may derive modifications and variations on the device and method disclosed, which nonetheless are within the spirit of the instant invention.

Accordingly, the invention is to be broadly construed within the scope of the appended claims.

Having thus described the invention and illustrated its use, what is claimed as new and is desired to be secured by Letters Patent is:

1. A tombstoning resistant surface mount electronic component in the configuration of a right parallelepiped, said component including top and bottom surfaces, side surfaces and parallel end surfaces, conductive termination means exiting at said end surfaces and a conductive termination coating overlying said end surfaces and abutting portions of at least one of said top and bottom surfaces, the portions of said termination coating overlying said top and bottom surfaces defining spaced terminal pads formed of a metal wettable by solder, the outermost portions of said coating overlying said end surfaces having a further coating of a non-solder wettable conductive metal.

2. The electronic component of claim 1, wherein said outermost portions of said further coating is formed of one or more metals selected from the group consisting of chromium, tungsten, aluminum and titanium.

3. The component of claim 2 wherein said terminal pads only are coated with a solder layer.

* * * * *